United States Patent
Kimoto

(10) Patent No.: US 8,564,357 B2
(45) Date of Patent: Oct. 22, 2013

(54) VOLTAGE LEVEL SHIFTING CIRCUIT

(75) Inventor: Richard C. Kimoto, Fremont, CA (US)

(73) Assignee: Pacesetter, Inc., Sunnyvale, CA (US)

( * ) Notice: Subject to any disclaimer, the term of this patent is extended or adjusted under 35 U.S.C. 154(b) by 137 days.

(21) Appl. No.: 13/091,039

(22) Filed: Apr. 20, 2011

(65) Prior Publication Data

US 2012/0268187 A1 Oct. 25, 2012

(51) Int. Cl.
*H03L 5/00* (2006.01)

(52) U.S. Cl.
USPC .............................. 327/333; 326/80; 326/81

(58) Field of Classification Search
USPC ....................... 327/333; 326/80, 81
See application file for complete search history.

(56) References Cited

U.S. PATENT DOCUMENTS

| 4,845,381 A | 7/1989 | Cuevas |
| 7,148,735 B2 * | 12/2006 | Ito et al. ........................ 327/333 |
| 7,382,172 B2 * | 6/2008 | Lin et al. ....................... 327/333 |
| 7,501,856 B2 * | 3/2009 | Huang ............................. 326/81 |
| 7,710,182 B2 * | 5/2010 | Yu et al. ......................... 327/333 |
| 7,768,308 B2 * | 8/2010 | Maede et al. .................. 326/68 |
| 7,777,547 B2 * | 8/2010 | Luo ................................ 327/333 |
| 8,278,969 B2 * | 10/2012 | Ng et al. ......................... 326/68 |

* cited by examiner

*Primary Examiner* — Kenneth B. Wells
(74) *Attorney, Agent, or Firm* — Steven M. Mitchell

(57) ABSTRACT

A level shifter shifts the level of an input signal from a second voltage domain to a first voltage domain. To accommodate different input signal levels (e.g., including sub-threshold input signal levels) that may arise due to changes in the supply voltage for the second voltage domain, current for a latch circuit of the level shifter is limited based on the supply voltage for the second voltage domain. In this way, a drive circuit of the level shifter that controls the latch circuit based on the input signal is able to initiate a change of state of the latch circuit over a wide range of input signal levels.

19 Claims, 7 Drawing Sheets

VOLTAGE LEVEL SHIFTING CIRCUIT

TECHNICAL FIELD

This application relates generally to electronic circuits and more specifically, but not exclusively, to a level shifting circuit.

BACKGROUND

Certain types of electronic devices have strict requirements on allowable power consumption. For example, it is desirable for implantable medical devices to have a long battery life to avoid subjecting the patient to a surgical procedure for battery replacement. Consequently, circuits used in such devices are generally developed to use as little power as possible while providing the desired functionality.

One way to reduce power consumption of a device is by lowering the operating voltage of circuits employed in the device. However, it may be impractical for all of the circuits in a given device to use a lower operating voltage. In such a case, level shifters may be used to interface between circuits operating at lower voltages and circuits operating at higher voltages.

FIG. 1 illustrates an example of a level shifter 100 that translates a digital signal from one voltage domain to another. The input IN of the level shifter 100 is in the low voltage domain and the output OUT is in the high voltage domain. Specifically, the low voltage domain lies between VSS and VDDL and the high voltage domain lies between VSS and VDDH.

The level shifter 100 consists of a latch which, through positive feedback, latches to the higher voltage domain (VDDH) to provide the output signal OUT. The lower voltage domain input signal IN drives a circuit which overcomes the current state of the latch, thereby causing the latch to switch between its bi-stable states whenever the input signal IN switches states.

The core of the level shifter 100 is comprised of transistors M1 through M4. PMOS transistors M1 and M2 comprise the latch. The transistors M1 and M2 are cross-coupled.

NMOS transistors M3 and M4 are used to initiate a switch in the state of the latch between its two bistable states. The transistors M3 and M4 are driven by the complementary input signal INp and INn. Therefore, when the transistor M3 is on (low impedance), the transistor M4 is off (high impedance) and vice versa.

The transistors are sized to enable the lower voltage transistors M3 and M4 to overpower the latch transistors M1 and M2. The transistors M1 and M2 are generally of the same size, as are the transistors M3 and M4. The ratio of the sizing of the NMOS pair (M3 and M4) to the PMOS pair (M1 and M2) controls the conditions under which the level shifter 100 shifts between different states. To start the latching action, the NMOS transistor that currently has its gate driven to VDDL must be able to overpower the PMOS transistor that currently has its gate-to-source voltage (Vgs) driven to VDDH. Thus, assuming equal transconductances of the NMOS and PMOS transistors, the aspect ratio (W/L) of the NMOS transistor must generally be larger than the aspect ratio of the PMOS transistor. Furthermore, to enable proper level shifting operation, a larger ratio between the NMOS and PMOS transistors is employed in devices that employ a larger difference between VDDH and VDDL.

There are several problems associated with conventional level shifters such as the level shifter of FIG. 1. In particular, such level shifters may not provide a desired level of performance over different input signal levels.

A level shifter designed for a specific VDDH level and a specific VDDL level (e.g., by sizing of the transistors) is not optimized for other VDDH and VDDL levels. For example, a level shifter optimized for a large VDDH to VDDL ratio, may operate too slowly for a lesser VDDH to VDDL difference. Here, since transistors have minimum allowable dimensions, either the width or the length of the transistor is usually fixed when trying to achieve large width to length ratios. Thus, if a higher ratio between the NMOS and PMOS transistors is desired to accommodate a larger VDDH to VDDL ratio, a larger NMOS transistor is called for. However, an increase in transistor size leads to more parasitic capacitances in the transistor. More parasitic capacitance, in turn, reduces the speed at which the level shifter is able to effectively operate.

Another problem with conventional level shifters occurs when the low voltage domain lies below the threshold voltage (sub-threshold) of the driving transistors. The "on" state or low impedance state of a transistor is usually associated with gate to source voltages greater than the transistor's threshold voltage, Vt. Vt may be the order of, for example, ½ volt to 1 volt for certain types of CMOS transistors. In strong inversion, to a first order, the dc output current to input gate drive (transconductance) is a linear function of Vgs when in saturation. This makes the sizing relatively simple when operating in strong inversion (i.e., non-sub-threshold).

In contrast, there is an exponential dependence upon the drive strength of a transistor operating in sub-threshold. As the voltage level of the low voltage domain is reduced below the threshold of the transistors, the size ratio between the NMOS and PMOS transistors needs to increase exponentially to ensure that the low voltage transistors (with exponentially decaying drive strength) can still overdrive the latch. Thus, if the low voltage domain is at a very low level (e.g., VDDL is <<Vt), the size ratio needed between the latch and low voltage transistors may be unfeasible. On the other hand, if the circuit is sized for a specific low and high voltage that is feasible, any change from these voltages may render the level shifter non-functional or sacrifice on speed and power.

One way of lowering the transistor size ratios in the level shifter of FIG. 1 is to employ two additional PMOS transistors above the transistors M1 and M2. One of these transistors is deployed between VDDH and the source of the transistor M1 and the other transistor is deployed between VDDH and the source of the transistor M2. These transistors are driven by the input INp and INn and thereby tend to reduce the drive strength of the latch so that lower NMOS to PMOS size ratios are needed. This has the effect of increasing the operable VDDH to VDDL range. However, even this circuit is not suitable for large VDDH to VDDL ranges since the same exponential ratios between the transistor pair M3 and M4 and the additional transistor pair are needed for sub-threshold operation.

SUMMARY

A summary of several sample aspects of the disclosure follows. It should be appreciated that this summary is provided for the convenience of the reader and does not wholly define the breadth of the disclosure. For convenience, one or more aspects or embodiments of the disclosure may be referred to herein simply as "some aspects" or "some embodiments."

The disclosure relates in some aspects to a level shifter that adapts to input signal conditions. Through the use of the disclosed techniques, effective level shifting may be achieved over a wide range of input signal levels as well as at subthreshold input signal levels. Such a level shifter may be advantageously employed, for example, to up level shift the digital output of a circuit (e.g., a current controlled oscillator) where the amplitude of the digital output varies over time and/or is at sub-threshold levels.

The level shifter provides an output signal for a first voltage domain (e.g., a VDDH domain) based on an input signal from a second voltage domain (e.g., a VDDL domain). The level shifter includes a latch circuit that provides the output signal. The level shifter also includes a drive circuit that provides signals for controlling the latch circuit based on the input signal.

The current provided for the latch circuit is limited based on the supply voltage for the second voltage domain. For example, a current limiting circuit (e.g., a current mirror circuit) may be added in series with the latch circuit and configured to limit the current sourced to the latch circuit based on this supply voltage. Here, the reference to the current limiting circuit is based on (e.g., set to be) the low supply voltage (e.g., VDDL) such that the allowable current into the latch circuit tracks the low supply voltage. Thus, at a lower supply voltage for the second voltage domain, the strength of the latch circuit (i.e., the current sourced to the latch circuit) is limited to enable the drive circuit to still be able to overdrive the latch circuit. Consequently, the drive circuit is able to initiate a change of state of the latch circuit over a wide range of input signal levels, including sub-threshold voltage levels.

BRIEF DESCRIPTION OF THE DRAWINGS

These and other features, aspects, and advantages will be more fully understood when considered with respect to the following detailed description, the appended claims, and the accompanying drawings, wherein:

Figure 1:
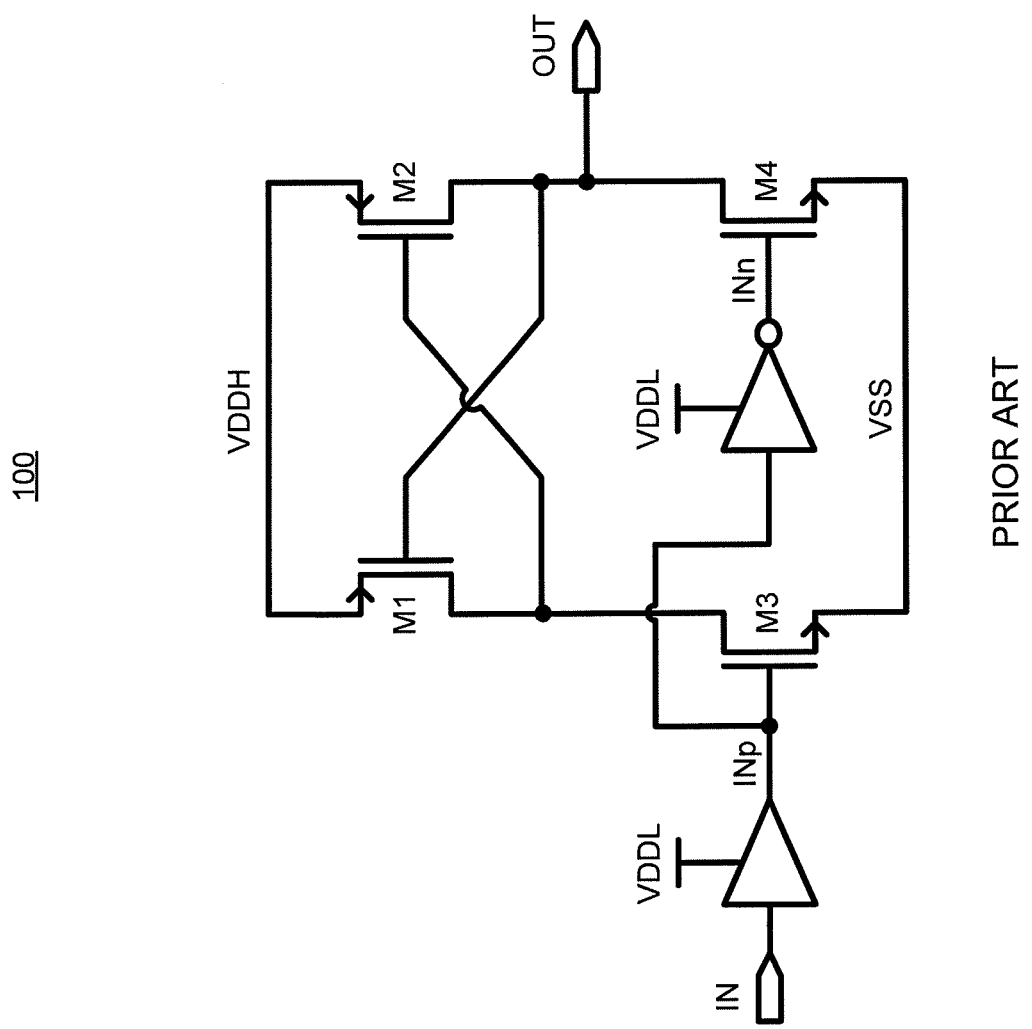
FIG. 1 is a simplified circuit diagram illustrating a conventional level shifter.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals may be used to denote like features throughout the specification and figures.

DETAILED DESCRIPTION

The description that follows sets forth one or more illustrative embodiments. It will be apparent that the teachings herein may be embodied in a wide variety of forms, some of which may appear to be quite different from those of the disclosed embodiments. Consequently, the specific structural and functional details disclosed herein are merely representative and do not limit the scope of the disclosure. For example, based on the teachings herein one skilled in the art should appreciate that the various structural and functional details disclosed herein may be incorporated in an embodiment independently of any other structural or functional details. Thus, an apparatus may be implemented or a method practiced using any number of the structural or functional details set forth in any disclosed embodiment(s). Also, an apparatus may be implemented or a method practiced using other structural or functional details in addition to or other than the structural or functional details set forth in any disclosed embodiment(s).

Figure 2:
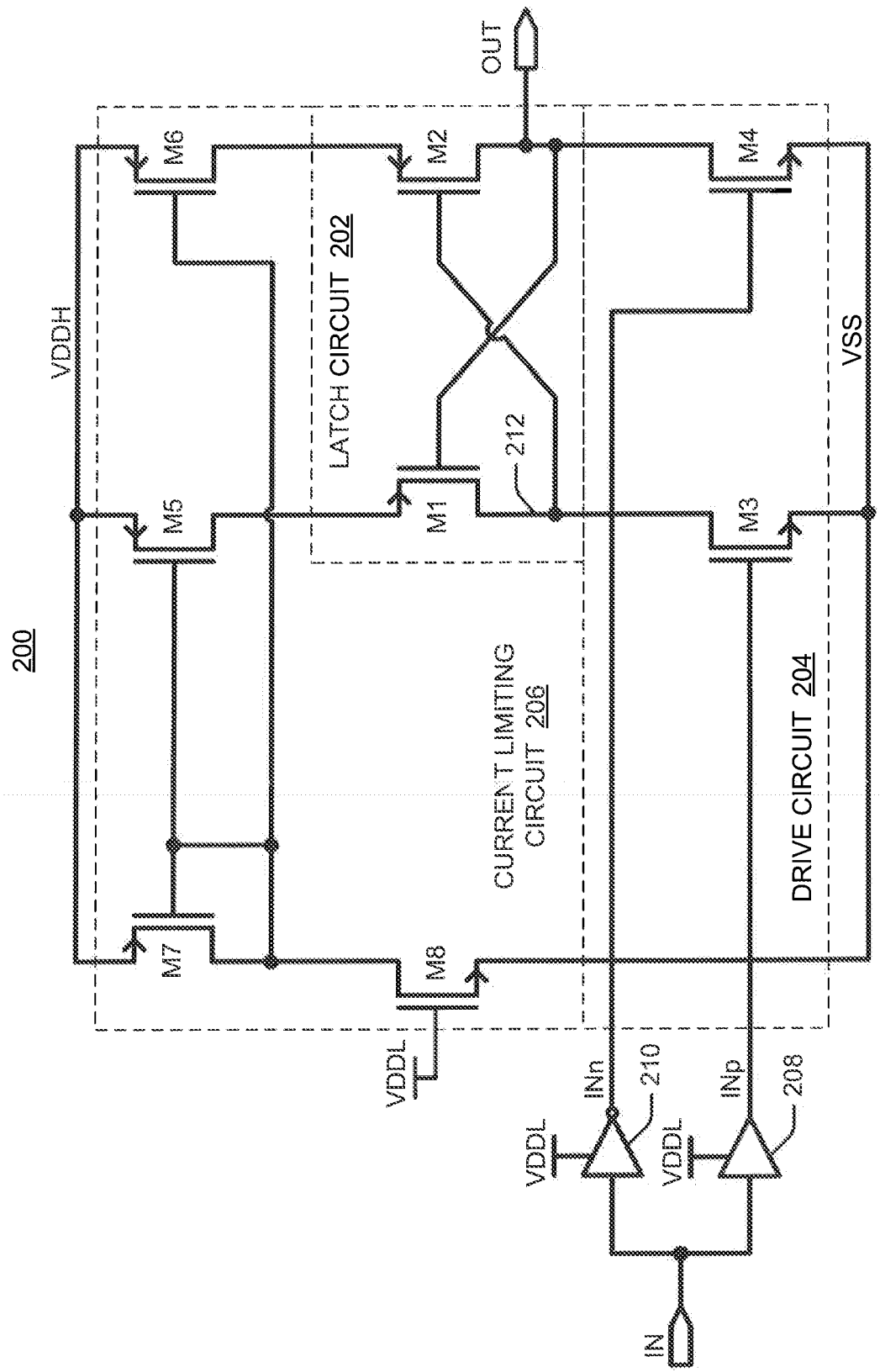
FIG. 2 is a simplified circuit diagram illustrating an example of a level shifter constructed in accordance with the teachings herein.

FIG. 2 illustrates an embodiment of a level shifter 200 that employs a latch circuit 202, a drive circuit 204, and a current limiting circuit 206 in accordance with the teachings herein. The current limiting circuit 206 limits the amount of current provided to the latch circuit 202. In particular, the current is limited based on the level of the supply voltage VDDL of a low power domain. At lower levels of VDDL, the drive circuit 204 will be driven by a lower level input signal (e.g., at a sub-threshold level). In this case, the current limiting circuit 206 will supply less current to the latch circuit due to the lower VDDL level. Consequently, the drive circuit 204 will still be able to overcome the current state of the latch circuit 202 under these circumstances.

The input signal IN is in the VDDL domain, while the output signal OUT is in the VDDH domain. In the low voltage domain, a digital signal in the "1" logic state has a voltage at VDDL. In the high voltage domain, a digital signal in the "1" logic state has a voltage at VDDH. Both domains share the same ground reference VSS. A digital signal at the "0" logic state in either the low voltage domain or high voltage domain has a voltage VSS.

FIG. 2 is depicted as including two logic gates 208 and 210 that provide a complementary input signal INp and INn in the VDDL domain. The logic gate 208 (e.g., a buffer) is not necessary, but is used to explicitly show that the INp signal is a VDDL domain signal. The input signal IN is inverted by the inverter logic gate 210 to provide the complementary INn in the VDDL domain.

The latch circuit 202 includes cross-coupled transistors M1 and M2. Through positive feedback, the latch has two bi-stable states, where the output signal OUT is either at VSS or VDDH. The gate of the transistor M1 is connected to the drain of the transistor M2, and vice-versa. When the transistor M1 has its gate driven towards VSS, the impedance of the transistor M1 impedance decreases, pulling up its drain. Since the gate of the transistor M2 is connected to the drain of the transistor M1, the voltage at the gate increases which acts to increase the impedance of the transistor M2. An increase in the impedance of the transistor M2 means that it is easier to pull down the drain of the transistor M2. This completes the feedback loop since the process commenced with pulling down the gate of the transistor M1 which is connected to the drain of the transistor M2. The gate of the transistor M2 is tied to the output OUT. This feedback is positive which means that pulling down the output OUT, makes it even easier to pull the output OUT down. This also means that the complementary node 212 (e.g., corresponding to a signal OUT*) will tend to pull up much more. Since the node 212 has VDDH as its supply, it will act as a low impedance to the supply. Thus, the node 212 will be pulled up to VDDH.

The drive circuit 204 includes transistors M3 and M4. These transistors initiate a switch in the state of the latch circuit whenever there is a change in the complementary input signal INp and INn.

The level shifter 200 operates as follows to convert a "1" logic state input signal IN to a "1" logic state output signal OUT. When INp is driven to VDDL, the transistor M3 lowers its impedance. This pulls down the gate of the transistor M2, which starts the latching action to pull the output OUT high. The transistor M4, since driven by INn, is high impedance when its gate goes to VSS. Therefore, it is easier for the transistor M2 to pull the output OUT high in this case.

The level shifter 200 operates as follows to convert a "0" logic state input signal IN to a "0" logic state output signal OUT. When INn is driven to VDDL, the transistor M4 lowers its impedance. This pulls down the gate of the transistor M1, which starts the latching action to pull the output OUT low. The transistor M3, since driven by INp, is high impedance when its gate goes to VSS. Therefore, it is easier for the transistor M1 to pull up its drain, and thus the gate of the transistor M2 high. When the gate of the transistor M2 goes high, it is easier for the transistor M4 to pull the output OUT to VSS.

In the example of FIG. 2, the current limiting circuit 206 takes the form of a current mirror circuit that includes transistors M5, M6, M7, and M8. The transistors M5 and M6 are in series (with respect to VDDH) with the transistors M1 and M2, respectively. These transistors act to limit the drive strength of the transistors M1 and M2, thereby making it easier for transistors M3 and M4 to drive the transistors M1 and M2 into the desired states.

The current allowed by the transistors M5 and M6 is fixed by the bias voltage generated by the transistor M7. The current through the transistor M7 is mirrored or copied in the transistors M5 and M6. Thus, the current through the transistor M7 sets the limiting current of the transistors M1 and M2.

The transistor M8 controls the limiting current. The current output of the transistor M8 goes through the transistor M7, which is mirrored to the transistors M5 and M6 and, in turn, limits the drive of the transistors M1 and M2. The current from the transistor M8 is, to a first order, a function of its gate voltage. Consequently, the gate voltage of the transistor M8 may be used to adjust the drive strength of the transistors M1 and M2.

The limiting current is set to track the drive current of the transistors M3 and M4. When switched on, the transistors M3 and M4 have their gates driven to VDDL. Thus the maximum drive strength of the transistors M3 and M4 will vary with VDDL. By setting the gate of the transistor M8 to VDDL (or some other function of VDDL), the limiting current for the transistors M1 and M2 also will vary with VDDL. Thus, the drive strength of the transistors M1 and M2 will track the drive strength of the transistors M3 and M4.

Advantageously, the current limiting circuit 206 automatically changes the current sourced to the latch circuit 202 by an amount that is substantially proportional to any change in the drive strength of the drive circuit 204, irrespective of whether the input signal has an amplitude that is above or below the threshold (Vt). For example, when VDDL is sub-threshold and decreasing, the current sourced to the latch transistors M1 and M2 will decrease exponentially. Consequently, since the drive current of the drive transistors M3 and M4 is also decreasing exponentially in this case, the transistors M3 and M4 will still be able to overdrive the transistors M1 and M2 to initiate a change of state when needed.

The ratio of the size of the transistor M8 to the size of each of the transistors M3 and M4 fixes the drive strength ratio of NMOS to PMOS in this example. This allows a fine tuning of level shifter operation over the desired VDDL and VDDH ranges.

There is static power consumption through the branch including the transistors M7 and M8. Since either of the transistors M1 or M2 will always be "on", the current mirror provided by the transistors M5, M6, and M7 is always "on." That is, the bias voltage generated at the gate of the transistor M7 is always non-zero, and thus conducting current. The static current will be small with a sub-threshold VDDL. However, the current increases with a higher VDDL. This increased static current is the trade-off for greater VDDL operating range.

The static current through the transistors M7 and M8 may be decreased without affecting the NMOS to PMOS drive strength ratio. By keeping the nominal ratio of the size of the transistor M8 to the size of each of the transistors M3 and M4 substantially the same as (e.g., equal to or approximately equal to) the nominal ratio of the size of the transistor M7 to the size of each of the transistors M5 and M6, the current through the transistors M7 and M8 may be reduced to a fraction of the drive strength of the transistors M3 and M4. Here, the ratios are nominal ratios in the sense that a circuit designed to have certain target ratio may or may not have that exact ratio due to variances in the manufacturing process. For example, two transistors designed to have the same size may not have exactly the same size. Similarly, two sets of transistors designed to have the same size ratios for each set may not have exactly the same ratios.

Through the use of devices constructed with size ratios as discussed above, the NMOS transistor and PMOS transistor drive strength ratios will substantially track over temperature, process, and voltages. Thus, the level shifter 200 may provide robust performance over a variety of operating conditions.

A level shifter as taught herein may be advantageously employed with a circuit that provides an output signal that varies over a range of voltages and/or that provides an output signal at a sub-threshold-level (e.g., 500 millivolts to 100 millivolts or lower). For example, the level shifter 200 may be employed to up level shift the output of a current controlled oscillator (e.g., a current starved oscillator) to a VDDH of 1.5 to 3.3 volts or higher.

Figure 3:
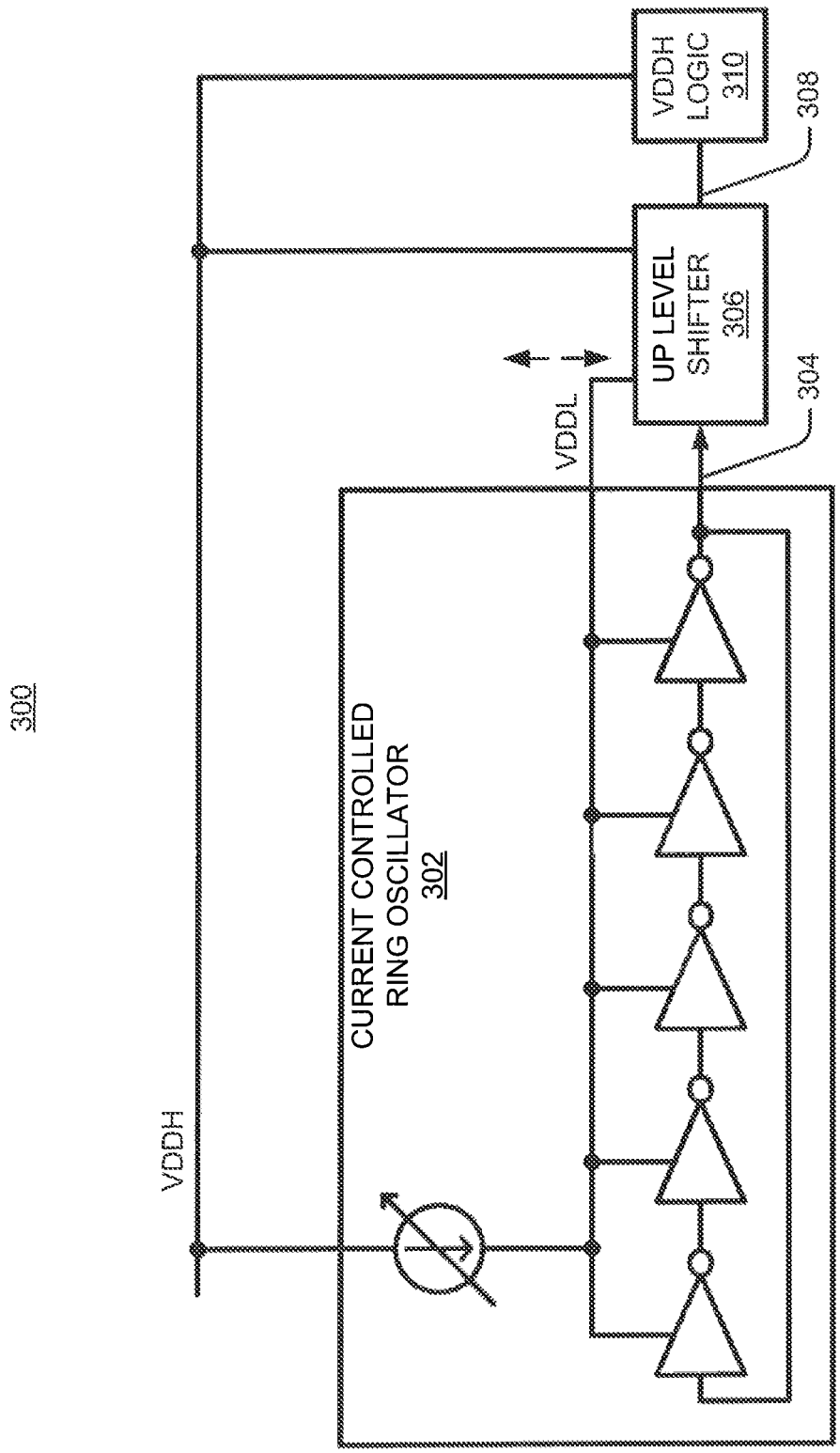
FIG. 3 is a simplified block diagram illustrating an example of circuit employing a level shifter constructed in accordance with the teachings herein.

FIG. 3 illustrates a sample circuit 300 that includes a current controlled ring oscillator 302. The oscillator 302 generates a signal 304 that may range from sub-threshold voltages up to the high supply voltage (VDDH). The oscillator 302 is current starved with a variable current reference. That is, by controlling the current into the oscillator 302, the frequency of the oscillator 302 may be adjusted over a wide range. However, the supply voltage (represented as VDDL in FIG. 3) to the ring portion of the oscillator 302 will vary as the current varies. At lower frequencies (currents), this supply voltage may go sub-threshold. At higher frequencies (currents), this supply voltage may go as high as the high supply voltage (VDDH). It is this input voltage range, from a sub-threshold to high supply in which a level shifter must be operable.

The circuit 300 employs an up level shifter 306 constructed in accordance with the teachings herein to up shift the signal 304 from the oscillator 302. Here, the amplitude of the signal 304 depends on the voltage level of VDDL. Thus, the signal 304 may range from sub-threshold levels to VDDH. As discussed above, the up level shifter 306 uses the VDDL voltage level to control the amount of current sourced to a latch circuit. Consequently, the up level shifter 306 is able to provide an output signal 308 at the VDDH level when the signal 304 is at any level of a designated voltage range (e.g., sub-threshold to VDDH). The output signal 308 is thus compatible with circuitry (VDDH logic 310) that operates at the VDDH voltage level domain.

Figure 4:
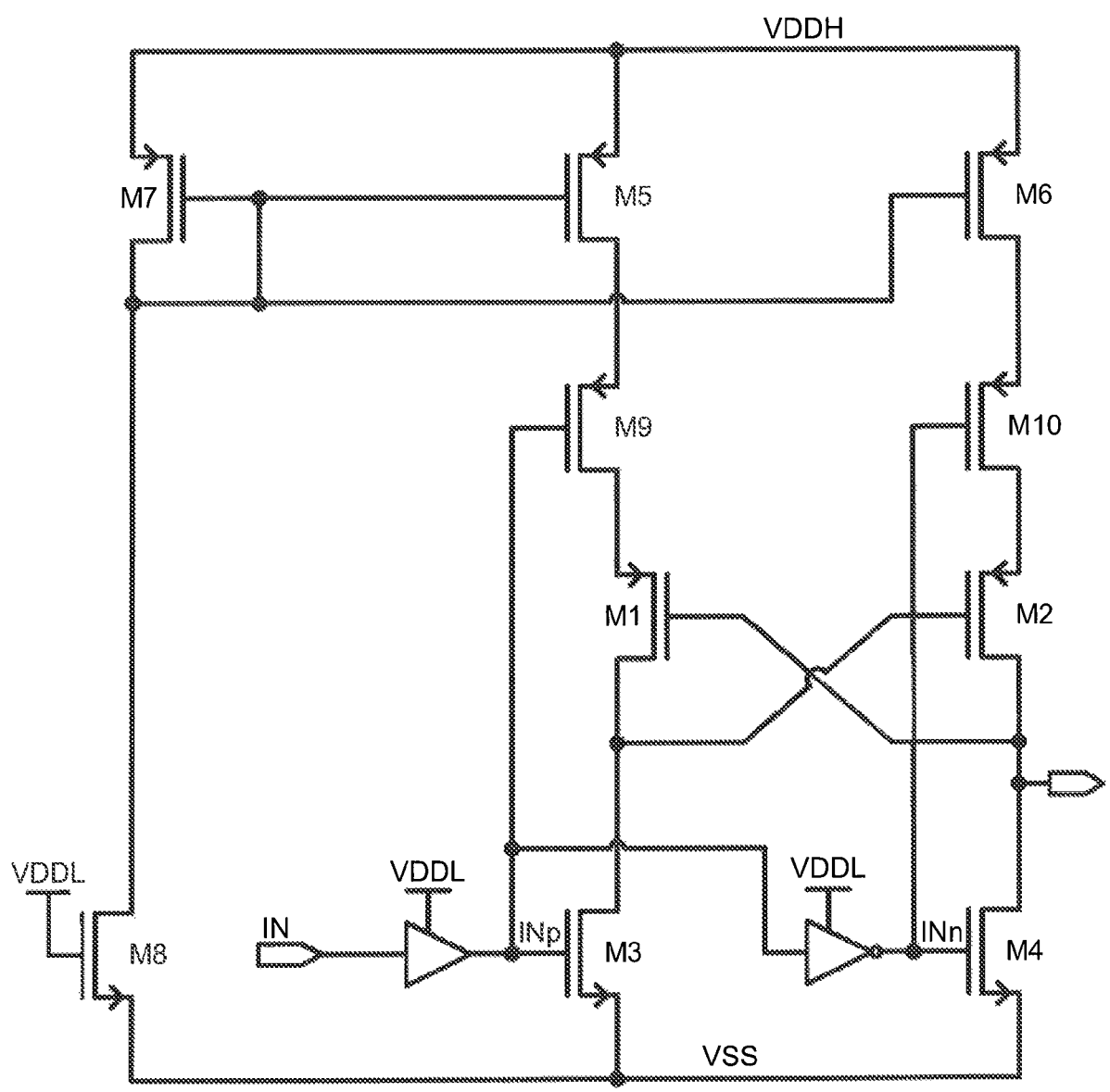
FIG. 4 is a simplified circuit diagram illustrating another example of a level shifter constructed in accordance with the teachings herein.

FIG. 4 illustrates another embodiment of a level shifter 400 constructed in accordance with the teachings herein. The level shifter 400 includes another pair of transistors M9 and M10 deployed in series between the transistors M1 and M2 and the transistors M5 and M6. The gates of the transistors M9 and M10 are driven by the complementary input signal INp and INn. This embodiment may serve to reduce the drive strength of the latch so that lower NMOS to PMOS size ratios are needed, thereby increasing the operable VDDH to VDDL range.

Figure 5:
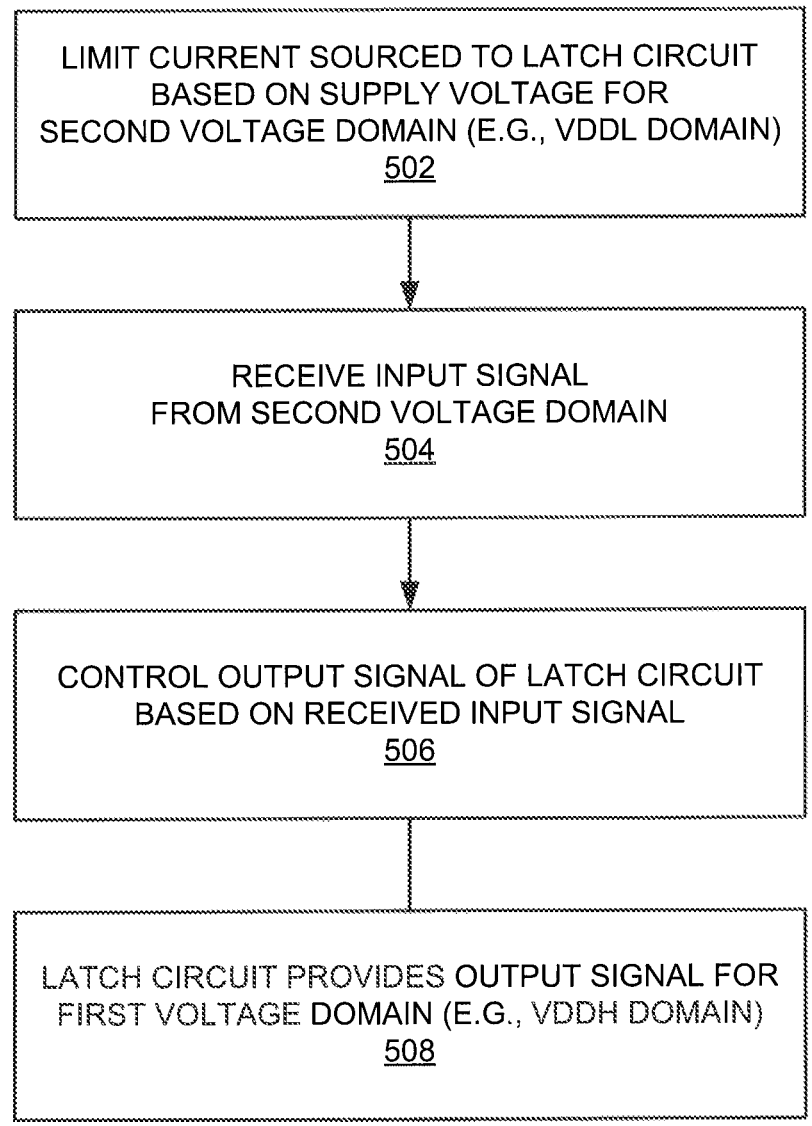
FIG. 5 is a simplified flowchart of an embodiment of operations that may be performed to provide level shifting in accordance with the teachings herein.

With the above in mind, several sample operations that may be performed to provide level shifting in accordance with the teachings herein will now be described with reference to the flowchart of FIG. 5. For convenience, the operations of FIG. 5 (or any other operations discussed or taught herein) may be described as being performed by specific components (e.g., the components of FIG. 2). It should be appreciated, however, that these operations may be performed by other types of components and may be performed using a different number of components. It also should be appreciated that one or more of the operations described herein may not be employed in a given implementation.

As represented by block 502, the current that is sourced to a latch circuit is limited based on a supply voltage for a second voltage domain (e.g., a VDDL domain). As discussed herein, this may involve controlling the current of a current mirror or some other suitable circuit as a function of the supply voltage (e.g., VDDL) for the second voltage domain.

As represented by block 504, an input signal is received from the second voltage domain. As discussed herein the amplitude of this input signal is limited by the magnitude of the supply voltage for the second voltage domain.

As represented by block 506, an output signal of the latch circuit is controlled based on the received input signal. For example, a drive circuit that receives the input signal may generate signals that initiate a change of state of the latch circuit as discussed herein.

As represented by block 508, the latch circuit thereby provides an output signal for a first voltage domain (e.g., a VDDH domain). Thus, a signal at the VDDH level is generated based on an input signal at the VDDL level.

Exemplary Cardiac Device

The discussion that follows describes an exemplary implantable cardiac device (e.g., a stimulation device such as an implantable cardioverter defibrillator, a pacemaker, etc.) within which a level shifter as taught herein may be employed. It is to be appreciated and understood that other devices (e.g., non-cardiac devices), including those that are not necessarily implantable, can be used and that the description below is given, in its specific context, to assist the reader in understanding, with more clarity, the embodiments described herein.

Figure 6:
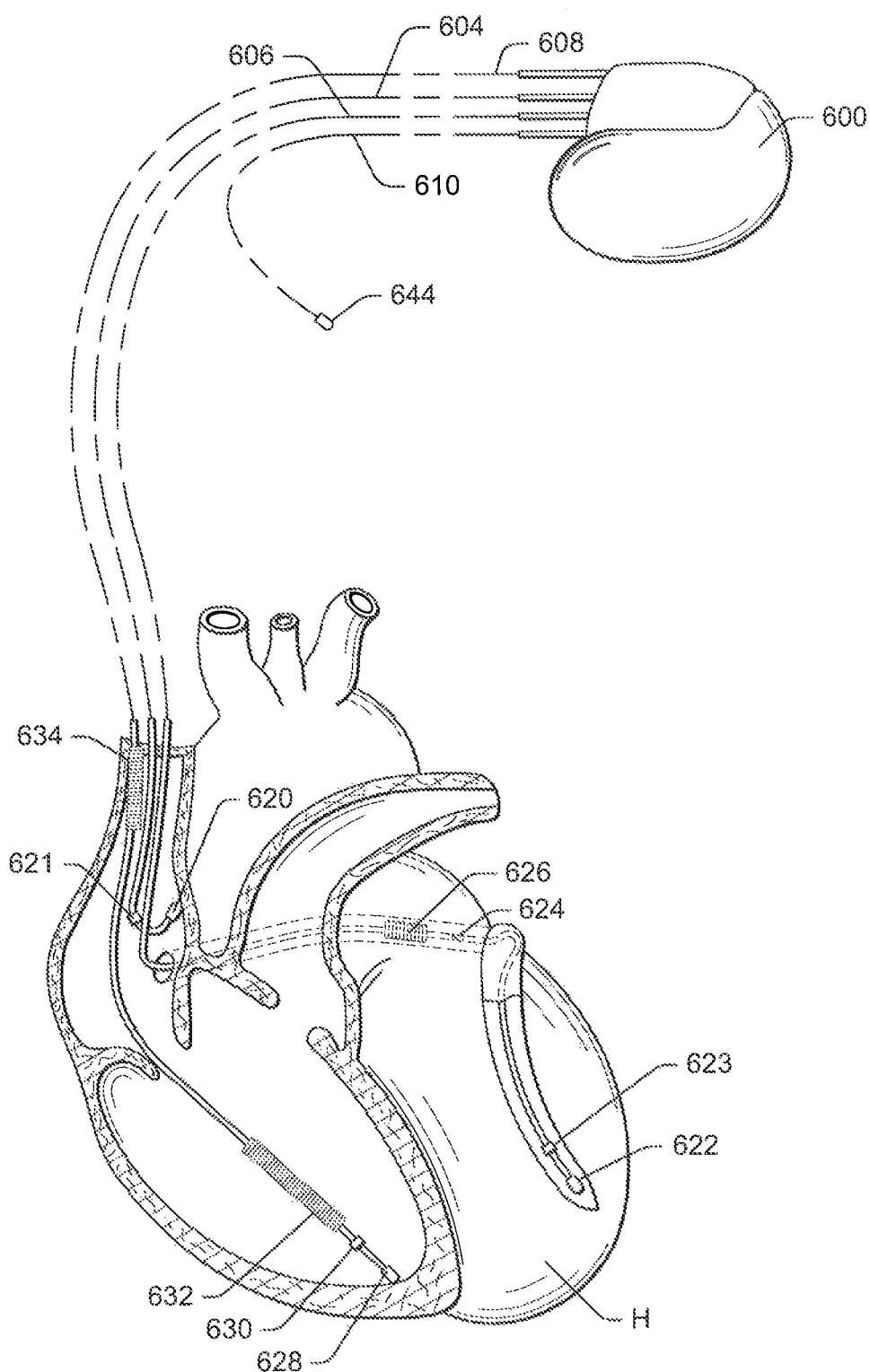
FIG. 6 is a simplified diagram of an embodiment of an implantable stimulation device in electrical communication with one or more leads implanted in a patient's heart for sensing conditions in the patient, delivering therapy to the patient, or providing some combination thereof.

FIG. 6 shows an exemplary implantable cardiac device 600 in electrical communication with a patient's heart H by way of three leads 604, 606, and 608, suitable for delivering multi-chamber stimulation and shock therapy. Bodies of the leads 604, 606, and 608 may be formed of silicone, polyurethane, plastic, or similar biocompatible materials to facilitate implant within a patient. Each lead includes one or more conductors, each of which may couple one or more electrodes incorporated into the lead to a connector on the proximal end of the lead. Each connector, in turn, is configured to couple with a complementary connector (e.g., implemented within a header) of the device 600.

To sense atrial cardiac signals and to provide right atrial chamber stimulation therapy, the device 600 is coupled to an implantable right atrial lead 604 having, for example, an atrial tip electrode 620, which typically is implanted in the patient's right atrial appendage or septum. FIG. 6 also shows the right atrial lead 604 as having an optional atrial ring electrode 621.

To sense left atrial and ventricular cardiac signals and to provide left chamber pacing therapy, the device 600 is coupled to a coronary sinus lead 606 designed for placement in the coronary sinus region via the coronary sinus for positioning one or more electrodes adjacent to the left ventricle, one or more electrodes adjacent to the left atrium, or both. As used herein, the phrase "coronary sinus region" refers to the vasculature of the left ventricle, including any portion of the coronary sinus, the great cardiac vein, the left marginal vein, the left posterior ventricular vein, the middle cardiac vein, the small cardiac vein or any other cardiac vein accessible by the coronary sinus.

Accordingly, an exemplary coronary sinus lead 606 is designed to receive atrial and ventricular cardiac signals and to deliver left ventricular pacing therapy using, for example, a left ventricular tip electrode 622 and, optionally, a left ventricular ring electrode 623; provide left atrial pacing therapy using, for example, a left atrial ring electrode 624; and provide shocking therapy using, for example, a left atrial coil electrode 626 (or other electrode capable of delivering a shock). For a more detailed description of a coronary sinus lead, the reader is directed to U.S. Pat. No. 5,466,254, "Coronary Sinus Lead with Atrial Sensing Capability" (Helland), which is incorporated herein by reference.

The device 600 is also shown in electrical communication with the patient's heart H by way of an implantable right ventricular lead 608 having, in this implementation, a right ventricular tip electrode 628, a right ventricular ring electrode 630, a right ventricular (RV) coil electrode 632 (or other electrode capable of delivering a shock), and a superior vena cava (SVC) coil electrode 634 (or other electrode capable of delivering a shock). Typically, the right ventricular lead 608 is transvenously inserted into the heart H to place the right ventricular tip electrode 628 in the right ventricular apex so that the RV coil electrode 632 will be positioned in the right ventricle and the SVC coil electrode 634 will be positioned in the superior vena cava. Accordingly, the right ventricular lead 608 is capable of sensing or receiving cardiac signals, and delivering stimulation in the form of pacing and shock therapy to the right ventricle.

The device 600 is also shown in electrical communication with a lead 610 including one or more components 644 such as a physiologic sensor. The component 644 may be positioned in, near or remote from the head.

It should be appreciated that the device 600 may connect to leads other than those specifically shown. In addition, the leads connected to the device 600 may include components other than those specifically shown. For example, a lead may include other types of electrodes, sensors or devices that serve to otherwise interact with a patient or the surroundings.

Figure 7:
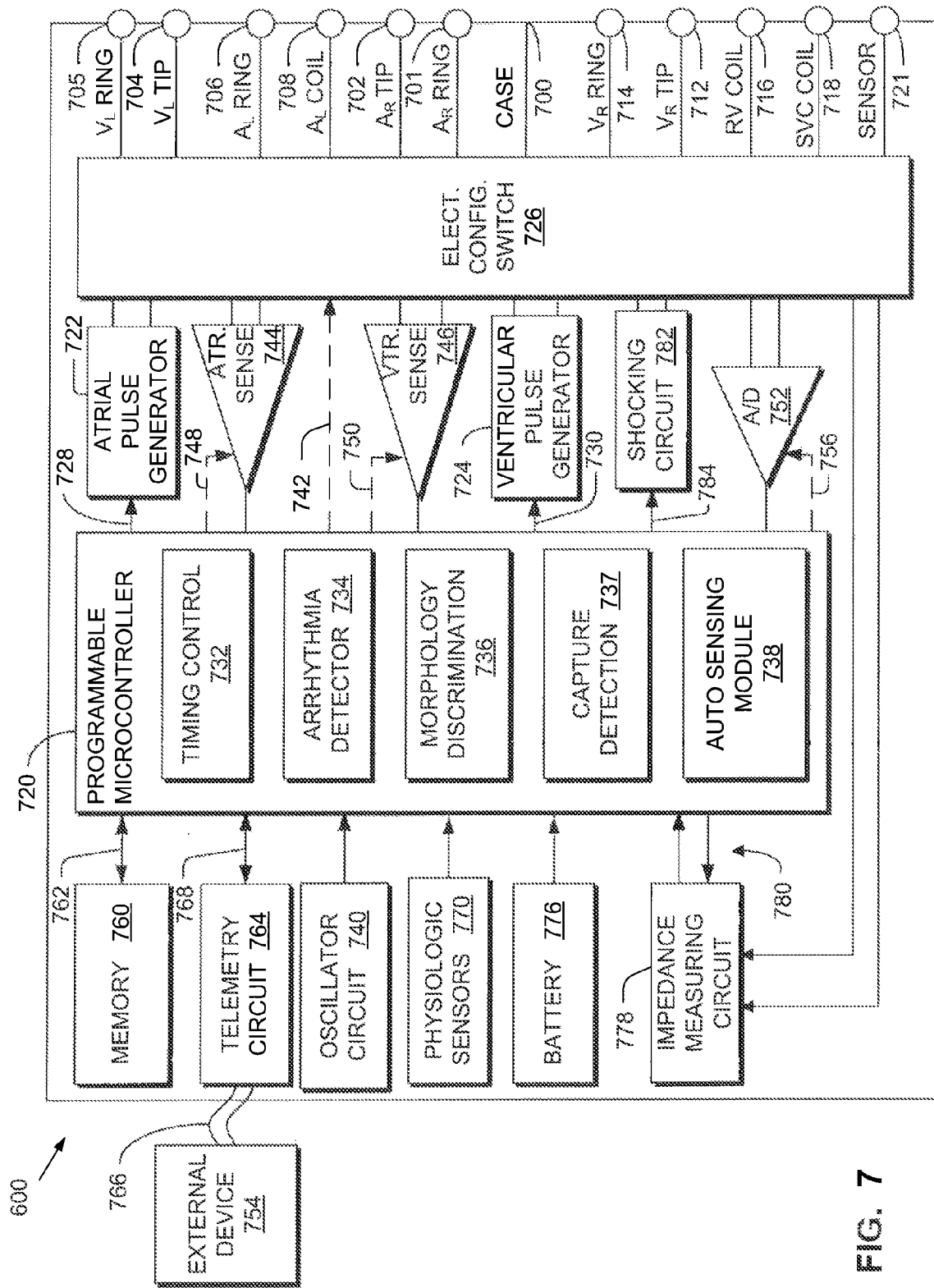
FIG. 7 is a simplified functional block diagram of an embodiment of an implantable cardiac device, illustrating basic elements that may be configured to sense conditions in the patient, deliver therapy to the patient, or provide some combination thereof.

FIG. 7 depicts an exemplary, simplified block diagram illustrating sample components of the device 600. The device 600 may be adapted to treat both fast and slow arrhythmias with stimulation therapy, including cardioversion, defibrillation, and pacing stimulation. While a particular multi-chamber device is shown, it is to be appreciated and understood that this is done for illustration purposes. Thus, the techniques and methods described below can be implemented in connection with any suitably configured or configurable device. Accordingly, one of skill in the art could readily duplicate, eliminate, or disable the appropriate circuitry in any desired combination to provide a device capable of treating the appropriate chamber(s) with, for example, cardioversion, defibrillation, and pacing stimulation.

A housing 700 for the device 600 is often referred to as the "can", "case" or "case electrode", and may be programmably selected to act as the return electrode for all "unipolar" modes. The housing 700 may further be used as a return electrode alone or in combination with one or more of the coil electrodes 626, 632 and 634 for shocking purposes. The housing 700 may be constructed of a biocompatible material (e.g., titanium) to facilitate implant within a patient.

The housing 700 further includes a connector (not shown) having a plurality of terminals 701, 702, 704, 705, 706, 708, 712, 714, 716 and 718 (shown schematically and, for convenience, the names of the electrodes to which they are connected are shown next to the terminals). The connector may be configured to include various other terminals (e.g., terminal 721 coupled to a sensor or some other component) depending on the requirements of a given application.

To achieve right atrial sensing and pacing, the connector includes, for example, a right atrial tip terminal (AR TIP) 702 adapted for connection to the right atrial tip electrode 620. A right atrial ring terminal (AR RING) 701 may also be included and adapted for connection to the right atrial ring electrode 621. To achieve left chamber sensing, pacing, and shocking, the connector includes, for example, a left ventricular tip terminal (VL TIP) 704, a left ventricular ring terminal (VL RING) 705, a left atrial ring terminal (AL RING) 706, and a left atrial shocking terminal (AL COIL) 708, which are adapted for connection to the left ventricular tip electrode 622, the left ventricular ring electrode 623, the left atrial ring electrode 624, and the left atrial coil electrode 626, respectively.

To support right chamber sensing, pacing, and shocking, the connector further includes a right ventricular tip terminal (VR TIP) 712, a right ventricular ring terminal (VR RING) 714, a right ventricular shocking terminal (RV COIL) 716, and a superior vena cava shocking terminal (SVC COIL) 718, which are adapted for connection to the right ventricular tip electrode 628, the right ventricular ring electrode 630, the RV coil electrode 632, and the SVC coil electrode 634, respectively.

At the core of the device 600 is a programmable microcontroller 720 that controls the various modes of stimulation therapy. As is well known in the art, microcontroller 720 typically includes a microprocessor, or equivalent control circuitry, designed specifically for controlling the delivery of stimulation therapy, and may further include memory such as RAM, ROM and flash memory, logic and timing circuitry, state machine circuitry, and I/O circuitry. Typically, microcontroller 720 includes the ability to process or monitor input signals (data or information) as controlled by a program code stored in a designated block of memory. The type of microcontroller is not critical to the described implementations. Rather, any suitable microcontroller 720 may be used that carries out the functions described herein. The use of microprocessor-based control circuits for performing timing and data analysis functions are well known in the art.

Representative types of control circuitry that may be used in connection with the described embodiments can include the microprocessor-based control system of U.S. Pat. No. 4,940,052 (Mann at al.), the state-machine of U.S. Pat. Nos. 4,712,555 (Thornander et al.) and 4,944,298 (Sholder), all of which are incorporated by reference herein. For a more detailed description of the various timing intervals that may be used within the device and their inter-relationship, see U.S. Pat. No. 4,788,980 (Mann et al.), also incorporated herein by reference.

FIG. 7 also shows an atrial pulse generator 722 and a ventricular pulse generator 724 that generate pacing stimulation pulses for delivery by the right atrial lead 604, the coronary sinus lead 606, the right ventricular lead 608, or some combination of these leads via an electrode configuration switch 726. It is understood that in order to provide stimulation therapy in each of the four chambers of the heart, the atrial and ventricular pulse generators 722 and 724 may include dedicated, independent pulse generators, multiplexed pulse generators, or shared pulse generators. The pulse generators 722 and 724 are controlled by the microcontroller 720 via appropriate control signals 728 and 730, respectively, to trigger or inhibit the stimulation pulses.

Microcontroller 720 further includes timing control circuitry 732 to control the timing of the stimulation pulses (e.g., pacing rate, atrio-ventricular (A-V) delay, atrial interconduction (A-A) delay, or ventricular interconduction (V-V) delay, etc.) or other operations, as well as to keep track of the timing of refractory periods, blanking intervals, noise detection windows, evoked response windows, alert intervals, marker channel timing, etc., as known in the art.

Microcontroller 720 further includes an arrhythmia detector 734. The arrhythmia detector 734 may be utilized by the device 600 for determining desirable times to administer various therapies. The arrhythmia detector 734 may be implemented, for example, in hardware as part of the microcontroller 720, or as software/firmware instructions programmed into the device 600 and executed on the microcontroller 720 during certain modes of operation.

Microcontroller 720 may include a morphology discrimination module 736, a capture detection module 737 and an auto sensing module 738. These modules are optionally used to implement various exemplary recognition algorithms or methods. The aforementioned components may be implemented, for example, in hardware as part of the microcontroller 720, or as software/firmware instructions programmed into the device 600 and executed on the microcontroller 720 during certain modes of operation.

The electrode configuration switch 726 includes a plurality of switches for connecting the desired terminals (e.g., that are connected to electrodes, coils, sensors, etc.) to the appropriate I/O circuits, thereby providing complete terminal and, hence, electrode programmability. Accordingly, switch 726, in response to a control signal 742 from the microcontroller 720, may be used to determine the polarity of the stimulation pulses (e.g., unipolar, bipolar, combipolar, etc.) by selectively closing the appropriate combination of switches (not shown) as is known in the art.

Atrial sensing circuits (ATR. SENSE) 744 and ventricular sensing circuits (VTR. SENSE) 746 may also be selectively coupled to the right atrial lead 604, coronary sinus lead 606, and the right ventricular lead 608, through the switch 726 for detecting the presence of cardiac activity in each of the four chambers of the heart. Accordingly, the atrial and ventricular sensing circuits 744 and 746 may include dedicated sense amplifiers, multiplexed amplifiers, or shared amplifiers. Switch 726 determines the "sensing polarity" of the cardiac signal by selectively closing the appropriate switches, as is also known in the art. In this way, the clinician may program the sensing polarity independent of the stimulation polarity.

The sensing circuits (e.g., circuits 744 and 746) are optionally capable of obtaining information indicative of tissue capture.

Each sensing circuit 744 and 746 preferably employs one or more low power, precision amplifiers with programmable gain, automatic gain control, bandpass filtering, a threshold detection circuit, or some combination of these components, to selectively sense the cardiac signal of interest. The automatic gain control enables the device 600 to deal effectively with the difficult problem of sensing the low amplitude signal characteristics of atrial or ventricular fibrillation.

The outputs of the atrial and ventricular sensing circuits 744 and 746 are connected to the microcontroller 720, which, in turn, is able to trigger or inhibit the atrial and ventricular pulse generators 722 and 724, respectively, in a demand fashion in response to the absence or presence of cardiac activity in the appropriate chambers of the heart. Furthermore, as described herein, the microcontroller 720 is also capable of analyzing information output from the sensing circuits 744 and 746, a data acquisition system 752, or both. This information may be used to determine or detect whether and to what degree tissue capture has occurred and to program a pulse, or pulses, in response to such determinations. The sensing circuits 744 and 746, in turn, receive control signals over signal lines 748 and 750, respectively, from the microcontroller 720 for purposes of controlling the gain, threshold, polarization charge removal circuitry (not shown), and the timing of any blocking circuitry (not shown) coupled to the inputs of the sensing circuits 744 and 746 as is known in the art.

For arrhythmia detection, the device 600 utilizes the atrial and ventricular sensing circuits 744 and 746 to sense cardiac signals to determine whether a rhythm is physiologic or pathologic. It should be appreciated that other components may be used to detect arrhythmia depending on the system objectives. In reference to arrhythmias, as used herein, "sensing" is reserved for the noting of an electrical signal or obtaining data (information), and "detection" is the processing (analysis) of these sensed signals and noting the presence of an arrhythmia.

Timing intervals between sensed events (e.g., P-waves, R-waves, and depolarization signals associated with fibrillation) may be classified by the arrhythmia detector 734 of the microcontroller 720 by comparing them to a predefined rate zone limit (e.g., bradycardia, normal, low rate VT, high rate VT, and fibrillation rate zones) and various other characteristics (e.g., sudden onset, stability, physiologic sensors, and morphology, etc.) in order to determine the type of remedial therapy that is needed (e.g., bradycardia pacing, anti-tachycardia pacing, cardioversion shocks or defibrillation shocks, collectively referred to as "tiered therapy"). Similar rules may be applied to the atrial channel to determine if there is an atrial tachyarrhythmia or atrial fibrillation with appropriate classification and intervention.

Cardiac signals or other signals may be applied to inputs of an analog-to-digital (A/D) data acquisition system 752. The data acquisition system 752 is configured (e.g., via signal line 756) to acquire intracardiac electrogram ("IEGM") signals or other signals, convert the raw analog data into a digital signal, and store the digital signals for later processing, for telemetric transmission to an external device 754, or both. For example, the data acquisition system 752 may be coupled to the right atrial lead 604, the coronary sinus lead 606, the right ventricular lead 608 and other leads through the switch 726 to sample cardiac signals across any pair of desired electrodes.

The data acquisition system 752 also may be coupled to receive signals from other input devices. For example, the data acquisition system 752 may sample signals from a physiologic sensor 770 or other components shown in FIG. 7 (connections not shown).

The microcontroller 720 is further coupled to a memory 760 by a suitable data/address bus 762, wherein the programmable operating parameters used by the microcontroller 720 are stored and modified, as required, in order to customize the operation of the device 600 to suit the needs of a particular patient. Such operating parameters define, for example, pacing pulse amplitude, pulse duration, electrode polarity, rate, sensitivity, automatic features, arrhythmia detection criteria, and the amplitude, waveshape and vector of each shocking pulse to be delivered to the patient's heart H within each respective tier of therapy. One feature of the described embodiments is the ability to sense and store a relatively large amount of data (e.g., from the data acquisition system 752), which data may then be used for subsequent analysis to guide the programming of the device 600.

Advantageously, the operating parameters of the implantable device 600 may be non-invasively programmed into the memory 760 through a telemetry circuit 764 in telemetric communication via communication link 766 with the external device 754, such as a programmer, transtelephonic transceiver, a diagnostic system analyzer or some other device. The microcontroller 720 activates the telemetry circuit 764 with a control signal (e.g., via bus 768). The telemetry circuit 764 advantageously allows intracardiac electrograms and status information relating to the operation of the device 600 (as contained in the microcontroller 720 or memory 760) to be sent to the external device 754 through an established communication link 766.

The device 600 can further include one or more physiologic sensors 770. In some embodiments the device 600 may include a "rate-responsive" sensor that may provide, for example, information to aid in adjustment of pacing stimulation rate according to the exercise state of the patient. One or more physiologic sensors 770 (e.g., a pressure sensor) may further be used to detect changes in cardiac output, changes in the physiological condition of the heart, or diurnal changes in activity (e.g., detecting sleep and wake states). Accordingly, the microcontroller 720 responds by adjusting the various pacing parameters (such as rate, A-V Delay, V-V Delay, etc.) at which the atrial and ventricular pulse generators 722 and 724 generate stimulation pulses.

While shown as being included within the device 600, it is to be understood that a physiologic sensor 770 may also be external to the device 600, yet still be implanted within or carried by the patient. Examples of physiologic sensors that may be implemented in conjunction with the device 600 include sensors that sense respiration rate, pH of blood, ventricular gradient, oxygen saturation, blood pressure and so forth. Another sensor that may be used is one that detects activity variance, wherein an activity sensor is monitored diurnally to detect the low variance in the measurement corresponding to the sleep state. For a more detailed description of an activity variance sensor, the reader is directed to U.S. Pat. No. 5,476,483 (Bornzin et al.), which patent is hereby incorporated by reference.

The one or more physiologic sensors 770 may optionally include one or more of components to help detect movement (via, e.g., a position sensor or an accelerometer) and minute ventilation (via an MV sensor) in the patient. Signals generated by the position sensor and MV sensor may be passed to the microcontroller 720 for analysis in determining whether to adjust the pacing rate, etc. The microcontroller 720 may thus monitor the signals for indications of the patient's position and activity status, such as whether the patient is climbing up stairs or descending down stairs or whether the patient is sitting up after lying down.

The device 600 additionally includes a battery 776 that provides operating power to all of the circuits shown in FIG. 7. For a device 600 which employs shocking therapy, the battery 776 is capable of operating at low current drains (e.g., preferably less than 10 µA) for long periods of time, and is capable of providing high-current pulses (for capacitor charging) when the patient requires a shock pulse (e.g., preferably, in excess of 2 A, at voltages above 200 V, for periods of 10 seconds or more). The battery 776 also desirably has a predictable discharge characteristic so that elective replacement time can be detected. Accordingly, the device 600 preferably employs lithium or other suitable battery technology.

The device 600 can further include magnet detection circuitry (not shown), coupled to the microcontroller 720, to detect when a magnet is placed over the device 600. A magnet may be used by a clinician to perform various test functions of the device 600 and to signal the microcontroller 720 that the external device 754 is in place to receive data from or transmit data to the microcontroller 720 through the telemetry circuit 764.

The device 600 further includes an impedance measuring circuit 778 that is enabled by the microcontroller 720 via a control signal 780. The known uses for an impedance measuring circuit 778 include, but are not limited to, lead impedance surveillance during the acute and chronic phases for proper performance, lead positioning or dislodgement; detecting operable electrodes and automatically switching to an operable pair if dislodgement occurs; measuring respiration or minute ventilation; measuring thoracic impedance for determining shock thresholds; detecting when the device 600 has been implanted; measuring stroke volume; and detecting the opening of heart valves, etc. The impedance measuring circuit 778 is advantageously coupled to the switch 726 so that any desired electrode may be used.

In the case where the device 600 is intended to operate as an implantable cardioverter/defibrillator (ICD) device, it detects the occurrence of an arrhythmia, and automatically applies an appropriate therapy to the heart aimed at terminating the detected arrhythmia. To this end, the microcontroller 720 further controls a shocking circuit 782 by way of a control signal 784. The shocking circuit 782 generates shocking pulses of low (e.g., up to 0.5 J), moderate (e.g., 0.5 J to 10 J), or high energy (e.g., 11 J to 40 J), as controlled by the microcontroller 720. Such shocking pulses are applied to the patient's heart H through, for example, two shocking electrodes and as shown in this embodiment, selected from the left atrial coil electrode 626, the RV coil electrode 632 and the SVC coil electrode 634. As noted above, the housing 700 may act as an active electrode in combination with the RV coil electrode 632, as part of a split electrical vector using the SVC coil electrode 634 or the left atrial coil electrode 626 (i.e., using the RV electrode as a common electrode), or in some other arrangement.

Cardioversion level shocks are generally considered to be of low to moderate energy level (so as to minimize pain felt by the patient), be synchronized with an R-wave pertain to the treatment of tachycardia, or some combination of the above. Defibrillation shocks are generally of moderate to high energy level (i.e., corresponding to thresholds in the range of 5 J to 40 J), delivered asynchronously (since R-waves may be too disorganized), and pertaining to the treatment of fibrillation. Accordingly, the microcontroller 720 is capable of controlling the synchronous or asynchronous delivery of the shocking pulses.

As mentioned above, the device 600 may include one or more components that provide level shifting functionality as taught herein. For example, an oscillator circuit 740 may comprise a current controlled oscillator and a level shifter as described above that provide clock signals to the microcontroller 720 (e.g., to the timing control circuitry 732) and/or other components of the device 600. It should be appreciated that a level shifter as taught herein may be employed in other circuits of the device 600 as well.

Various modifications may be incorporated into the disclosed embodiments based on the teachings herein. For example, a current limiting circuit as taught herein may be implemented using circuitry other than a current mirror. Also, a latch circuit and/or a drive circuit as taught herein may be implemented using circuitry other than the specific circuitry illustrated herein. Furthermore the circuitry described herein may be implemented with other types of components (e.g., using bi-polar transistors rather than CMOS transistors).

The various structures and functions described herein may be incorporated into a variety of apparatuses (e.g., a stimulation device, a monitoring device, etc.) and implemented in a variety of ways. Different embodiments of such an apparatus may include a variety of hardware and software processing components. In some embodiments, hardware components such as processors, controllers, state machines, logic, or some combination of these components, may be used to implement the described components or circuits.

In some embodiments, code including instructions (e.g., software, firmware, middleware, etc.) may be executed on one or more processing devices to implement one or more of the described functions or components. The code and associated components (e.g., data structures and other components used by the code or used to execute the code) may be stored in an appropriate data memory that is readable by a processing device (e.g., commonly referred to as a computer-readable medium).

Moreover, some of the operations described herein may be performed by a device that is located externally with respect to the body of the patient. For example, an implanted device may send raw data or processed data to an external device that then performs the necessary processing.

The components and functions described herein may be connected or coupled in many different ways. The manner in which this is done may depend, in part, on whether and how the components are separated from the other components. In some embodiments some of the connections or couplings represented by the lead lines in the drawings may be in an integrated circuit, on a circuit board or implemented as discrete wires or in other ways.

The signals discussed herein may take various forms. For example, in some embodiments a signal may comprise electrical signals transmitted over a wire, light pulses transmitted through an optical medium such as an optical fiber or air, or RF waves transmitted through a medium such as air, and so on. In addition, a plurality of signals may be collectively referred to as a signal herein. The signals discussed above also may take the form of data. For example, in some embodiments an application program may send a signal to another application program. Such a signal may be stored in a data memory.

Moreover, the recited order of the blocks in the processes disclosed herein is simply an example of a suitable approach. Thus, operations associated with such blocks may be rearranged while remaining within the scope of the present disclosure. Similarly, the accompanying method claims present operations in a sample order, and are not necessarily limited to the specific order presented.

Also, it should be understood that any reference to elements herein using a designation such as "first," "second," and so forth does not generally limit the quantity or order of those elements. Rather, these designations may be used herein as a convenient method of distinguishing between two or more different elements or instances of an element. Thus, a reference to first and second elements does not mean that only two elements may be employed there or that the first element must precede the second element in some manner. Also, unless stated otherwise a set of elements may comprise one or more elements.

While certain embodiments have been described above in detail and shown in the accompanying drawings, it is to be understood that such embodiments are merely illustrative of and not restrictive of the teachings herein. In particular, it should be recognized that the teachings herein apply to a wide variety of apparatuses and methods. It will thus be recognized that various modifications may be made to the illustrated embodiments or other embodiments, without departing from the broad scope thereof. In view of the above it will be understood that the teachings herein are intended to cover any changes, adaptations or modifications which are within the scope of the disclosure.

What is claimed is:

1. An apparatus, comprising:
a latch circuit configured to provide an output signal for a first voltage domain;
a drive circuit configured to provide signals for controlling the latch circuit based on an input signal from a second voltage domain; and
a current limiting circuit comprising a first circuit and a second circuit, wherein the first circuit is configured to receive a supply voltage for the second voltage domain and to control current flow through the second circuit based on the received supply voltage for the second voltage domain, and wherein the second circuit is coupled in series between the latch circuit and a supply voltage for the first voltage domain to limit current sourced to the latch circuit from the supply voltage for the first voltage domain.

2. The apparatus of claim 1, wherein the current limiting circuit is a current mirror circuit.

3. The apparatus of claim 1, wherein the current limiting circuit reduces the current sourced to the latch circuit in response to a decrease in the supply voltage for the second voltage domain.

4. The apparatus of claim 1, wherein:
a change in the supply voltage for the second voltage domain results in a change in amplitude of the input signal;
the change in amplitude of the input signal results in a change in drive strength of the signals provided by the drive circuit; and
the limiting of the current comprises changing the current by an amount that is substantially proportional to the change in drive strength.

5. The apparatus of claim 1, wherein:
the supply voltage for the second voltage domain is variable through a voltage range;
the voltage range extends from a first level that is below a threshold level of an input transistor of the drive circuit to a second level that is above the threshold level.

6. The apparatus of claim 5, wherein the second level comprises the supply voltage for the second voltage domain.

7. The apparatus of claim 1, further comprising a current controlled oscillator, wherein the input signal comprises an output signal of the current controlled oscillator.

8. The apparatus of claim 1, wherein:
the drive circuit comprises a first transistor pair;
the latch circuit comprises a cross-coupled transistor pair;
the current limiting circuit is a current mirror circuit;
the second circuit comprises a second transistor pair;
the cross-coupled transistor pair is coupled to the supply voltage for the first voltage domain via the second transistor pair;
the cross-coupled transistor pair is coupled to a circuit ground via the first transistor pair; and
the input signal comprises a pair of complementary signals that drive the first transistor pair.

9. The apparatus of claim 8, wherein:
the first circuit of the current mirror circuit comprises a first transistor that provides a bias voltage for the second transistor pair; and
the first circuit of the current mirror circuit comprises a second transistor that sets current flow through the first transistor based on the supply voltage for the second voltage domain.

10. The apparatus of claim 1 wherein:
the latch circuit comprises cross-coupled PMOS transistors;
the current limiting circuit comprises PMOS transistors that couple source terminals of the cross-coupled PMOS transistors to the supply voltage for the first voltage domain;
the drive circuit comprises NMOS transistors that couple drain terminals of the cross-coupled PMOS transistors to a circuit ground; and
the input signal comprises a pair of complementary signals that drive gate terminals of the NMOS transistors.

11. The apparatus of claim 10, wherein the current limiting circuit comprises:
a first PMOS transistor that provides a bias voltage for the PMOS transistors of the current limiting circuit; and
a first NMOS transistor that sets current flow through the first PMOS transistor based on the supply voltage for the second voltage domain.

12. The apparatus of claim 9, wherein:
a size of the first transistor differs from a size of each transistor of the second transistor pair by a defined nominal ratio; and
a size of the second transistor differs from a size of each transistor of the first transistor pair by the defined nominal ratio.

13. The apparatus of claim 12, wherein:
the size of the second transistor is smaller than the size of each transistor of the first transistor pair such that the current flow through the first transistor is less than the current sourced to the latch circuit.

14. A level shifter, comprising:
a cross-coupled transistor pair configured to provide an output signal for a first voltage domain;
a first transistor pair configured to provide signals for controlling the cross-coupled transistor pair based on an input signal from a second voltage domain, wherein the cross-coupled transistor pair is coupled to a circuit ground via the first transistor pair; and
a current limiting circuit comprising a second transistor pair, a first transistor that provides a bias voltage for the second transistor pair, and a second transistor that sets current flow through the first transistor based on a supply voltage for the second voltage domain, wherein the current limiting circuit is configured to limit current sourced to the cross-coupled transistor pair based on the supply voltage for the second voltage domain, and wherein the cross-coupled transistor pair is coupled to a supply voltage for the first voltage domain via the second transistor pair.

15. The level shifter of claim 14, wherein;
    a size of the first transistor differs from a size of each transistor of the second transistor pair by a defined nominal ratio; and
    a size of the second transistor differs from a size of each transistor of the first transistor pair by the defined nominal ratio.

16. The level shifter of claim 14, wherein the current limiting circuit is a current mirror circuit.

17. An apparatus, comprising:
    a cross-coupled transistor pair configured to provide an output signal for a first voltage domain;
    a first transistor pair configured to provide signals for controlling the cross-coupled transistor pair based on an input signal from a second voltage domain;
    a second transistor pair coupled in series between the cross-coupled transistor pair and a supply voltage for the first voltage domain to limit current sourced to the cross-coupled transistor pair from the supply voltage for the first voltage domain; and
    a control circuit configured to receive a supply voltage for the second voltage domain and to control current flow through the second transistor pair based on the received supply voltage for the second voltage domain.

18. The apparatus of claim 17, wherein the control circuit comprises:
    a first transistor that provides a bias voltage for the second transistor pair; and
    a second transistor that sets current flow through the first transistor based on the supply voltage for the second voltage domain.

19. The apparatus of claim 17, wherein the control circuit and the second transistor pair are a current mirror circuit.

* * * * *